(12) United States Patent
Wang et al.

(10) Patent No.: US 8,907,447 B2
(45) Date of Patent: Dec. 9, 2014

(54) POWER INDUCTORS IN SILICON

(76) Inventors: Mingliang Wang, San Diego, CA (US); Huikai Xie, Gainesville, FL (US); Khai D. T. Ngo, Blacksburg, VA (US)

(*) Notice: Subject to any disclaimer, the term of this patent is extended or adjusted under 35 U.S.C. 154(b) by 61 days.

(21) Appl. No.: 13/579,423

(22) PCT Filed: Feb. 17, 2011

(86) PCT No.: PCT/US2011/025186
§ 371 (c)(1),
(2), (4) Date: Aug. 16, 2012

(87) PCT Pub. No.: WO2011/103259
PCT Pub. Date: Aug. 25, 2011

(65) Prior Publication Data
US 2013/0187255 A1    Jul. 25, 2013

Related U.S. Application Data

(60) Provisional application No. 61/306,440, filed on Feb. 19, 2010.

(51) Int. Cl.
| H01L 29/00 | (2006.01) |
| H01F 17/04 | (2006.01) |
| H01F 27/02 | (2006.01) |
| H01L 49/02 | (2006.01) |
| H01F 27/28 | (2006.01) |

(52) U.S. Cl.
CPC .............. *H01L 28/10* (2013.01); *H01F 17/043* (2013.01); *H01F 27/027* (2013.01); *H01F 27/2871* (2013.01)
USPC .......................................... 257/531; 438/381

(58) Field of Classification Search
CPC ........................................................ H01L 28/10
USPC .............. 257/E21.022, 21.409, 531; 438/597
See application file for complete search history.

(56) References Cited

U.S. PATENT DOCUMENTS

| 4,415,959 A | 11/1983 | Vinciarelli |
| 6,101,371 A | 8/2000 | Barber et al. |
| 6,110,806 A | 8/2000 | Pogge |
| 6,121,659 A | 9/2000 | Christensen et al. |

(Continued)

OTHER PUBLICATIONS

The International Search Report and Written Opinion for PCT/US2011/025186 dated Nov. 25, 2011.

(Continued)

*Primary Examiner* — Theresa T Doan
(74) *Attorney, Agent, or Firm* — Thomas | Horstemeyer, LLP.

(57) ABSTRACT

Various methods and systems are provided for power inductors in silicon (PIiS) In one embodiment, a PIiS includes a magnetic core of magnetic material embedded in a silicon substrate, and a conductive winding having a plurality of turns, where adjacent turns of the conductive winding have a space therebetween, and where at least a portion of the magnetic core is encircled by the conductive winding In another embodiment, a DC to DC converter includes a PIiS, which includes a magnetic core of magnetic material embedded in a silicon substrate, a conductive winding having a plurality of turns, where at least a portion of the magnetic core is encircled by the conductive winding, and a cap layer of magnetic material disposed on at least one side of the silicon substrate The DC to DC converter also includes an integrated circuit mounted on the cap layer of the power inductor in silicon.

29 Claims, 12 Drawing Sheets

(56) References Cited

U.S. PATENT DOCUMENTS

| | | | |
|---|---|---|---|
| 6,535,098 | B1 | 3/2003 | Yeo et al. |
| 6,953,985 | B2 | 10/2005 | Lin et al. |
| 7,084,724 | B2 | 8/2006 | Cetiner et al. |
| 7,236,212 | B2 * | 6/2007 | Carr et al. ............ 348/726 |
| 7,250,842 | B1 | 7/2007 | Johnson et al. |
| 7,531,407 | B2 * | 5/2009 | Clevenger et al. ............ 438/238 |
| 2007/0267138 | A1 | 11/2007 | White et al. |

OTHER PUBLICATIONS

M.W., et al., "Design and Fabrication of Integrated Power Inductor Based on Silicon Molding Technology," IEEE Power Electronics Specialists Conference, Jun. 2007, pp. 1612-1618.

J.M.B.,et al., "Micro Fabricated Power Inductors on Silicon," IEEE 33rd Annual Power Electronics Specialists Conference Jun. 2002, pp. 1225-1229.

J.H., et al., "AC Resistance of Planar Power Inductors and the Quasidistributed Gap Technique," IEEE Transactions on Power Electronics, vol. 16, Issue 4, Jul. 2001, pp. 558-567.

C.R.S., et al., "Design of Microfabricated Transformers and Inductors for High Frequency Power Conversion," IEEE Transactions on Power Electronicsvol. 11, Issue 2, Mar. 1996, pp. 228-238.

C.J.W., et al., "Minimum Weight EI core and Pot core Inductor and Transformer Designs", IEEE Transactions on Magnetics, Sep. 1980, pp. 755-757.

Yoon, et al., Embedded Solenoid Inductors for RF CMOS Power Amplifiers, Sep. 2006; http://mems.gatech.edu/msmawebsite_2006/publications/publication_list_files/2001/Embedded%20Solenoid%20Inductors%20for%20RF%20CMOS%20Power%20Amplifier.pdf.

Park,et al., "Polydimethylsiloxane-based Pattern Transfer Process for the Post-IC Intgegration of MEMS onto CMOS chips," Journal of Micromechanics and Microenginering, Nov. 18, 2002.

Sanchez, et al., "Evolution of the Classical Functional Integration Towers a 3D Heterogeneous Functional Integration," Mixed Design of Integrated Circuits and Systems, 2007, MIXDES '07, 14th International Conference, Jun. 21-13, 2007.

Ahn, et al., "Micromachined Planar Inductors on Silicon Wafers for MEMS Applications", IEEE Transactions on Industrial Electronics, vol. 45, No. 6, Dec. 1998.

Park, et al., "Packaging Compatible Microtransformers on a Silicon Substrate," Advanced Packaging, IEEE Transactions vol. 26, Issue 2, pp. 160-164, May 2003.

International Preliminary Report on Patentability for PCT/US2011/025186 dated Aug. 21, 2012.

* cited by examiner

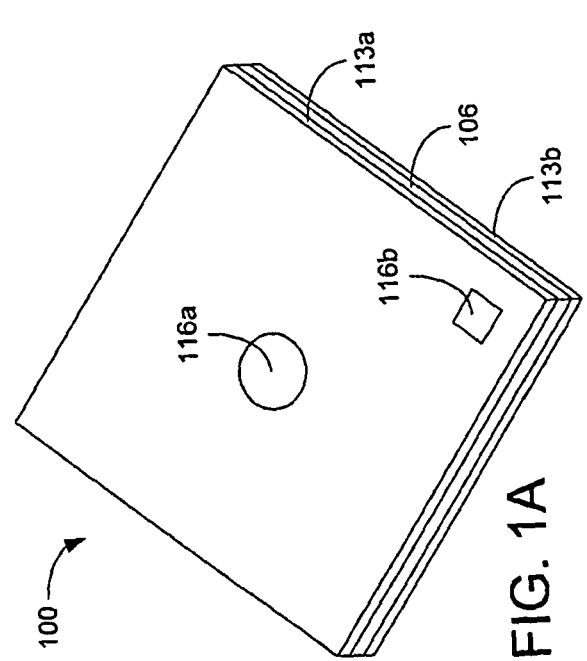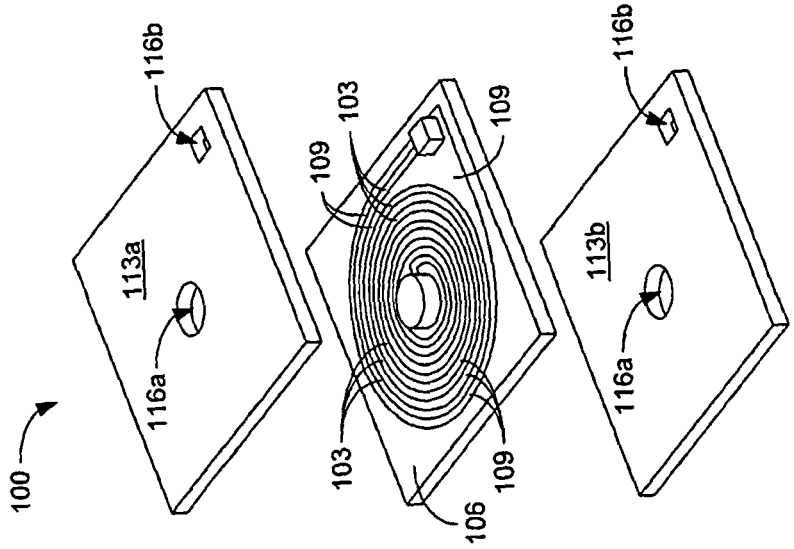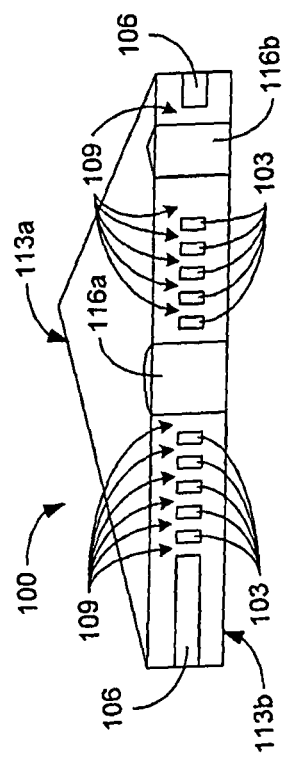

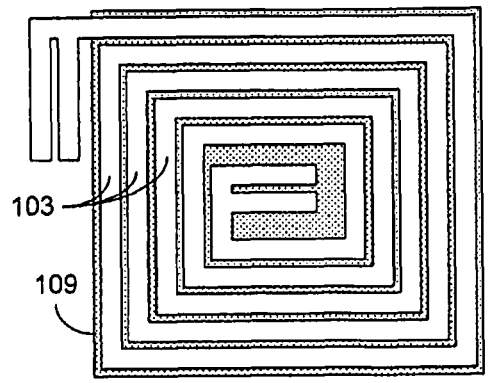
FIG. 1D
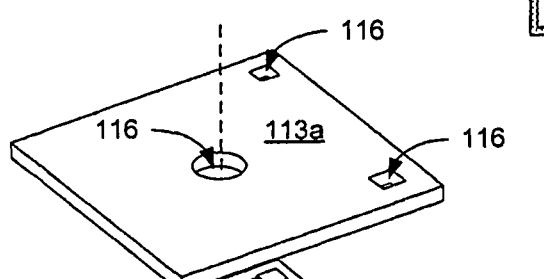
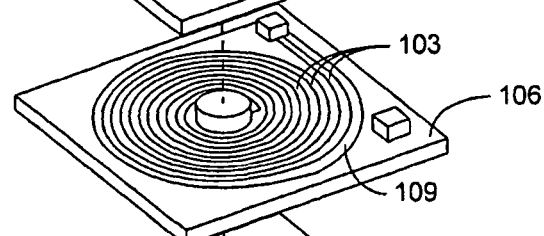
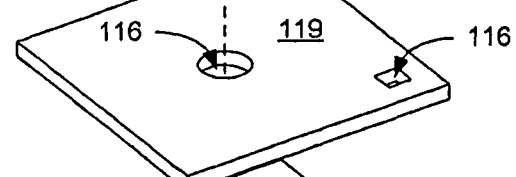
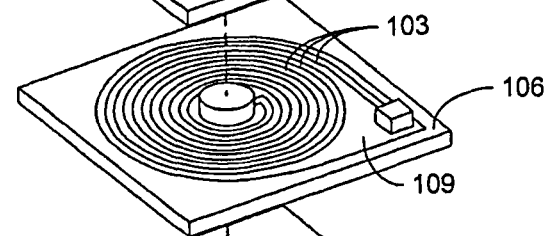
FIG. 1E

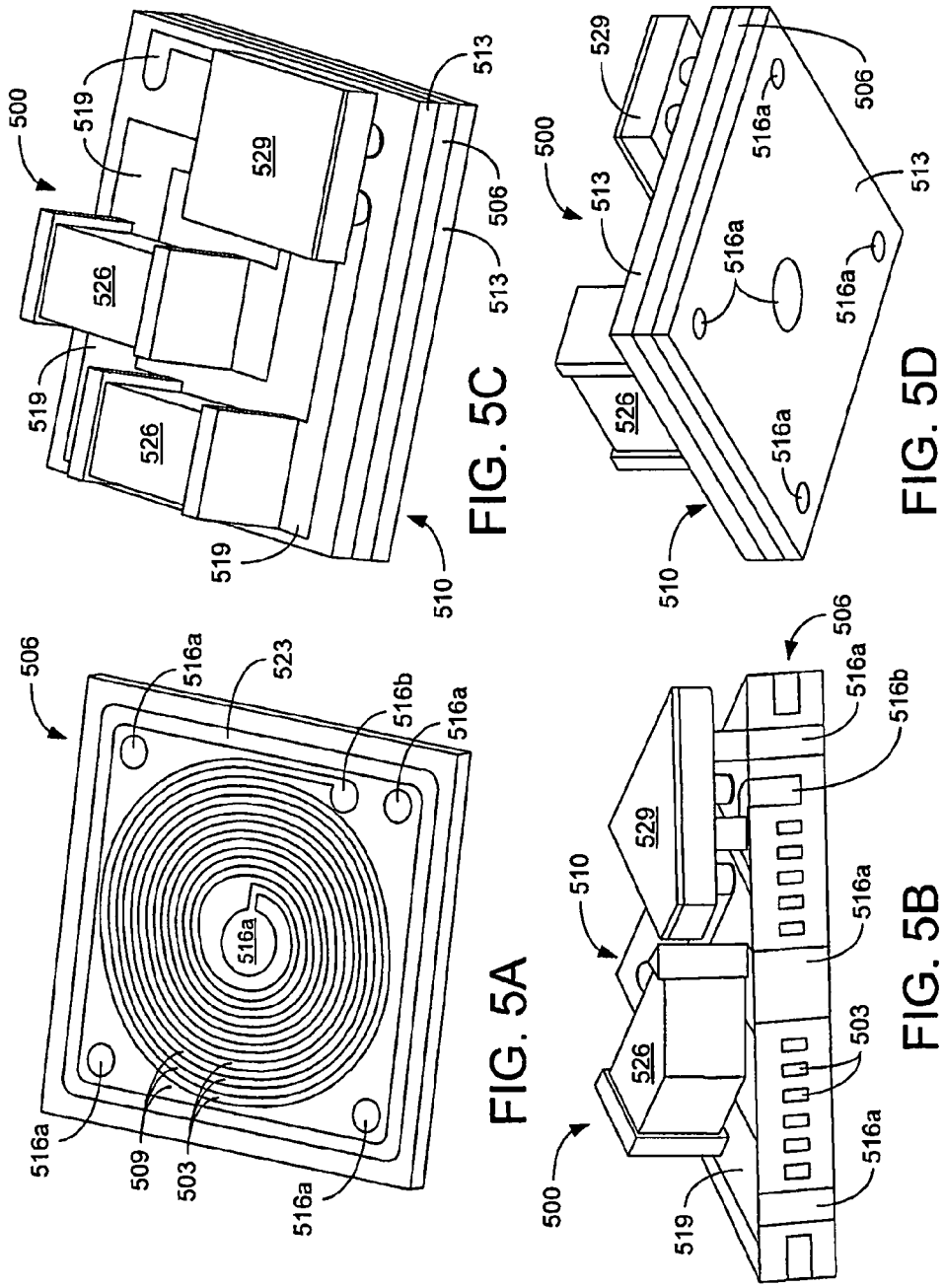

US 8,907,447 B2

POWER INDUCTORS IN SILICON

CROSS REFERENCE TO RELATED APPLICATIONS

This application is the 35 U.S.C. §371 national stage of PCT application PCT/US2011/025186, filed Feb. 17, 2011, which claims priority to and the benefit of U.S. provisional application entitled "INTEGRATED POWER INDUCTORS IN SILICON FOR COMPACT POWER SYSTEMS" having Ser. No. 61/306,440, filed Feb. 19, 2010, both of which are hereby incorporated by reference in their entirety.

STATEMENT REGARDING FEDERALLY SPONSORED RESEARCH OR DEVELOPMENT

This invention was made with government support under agreement ECS-0601294 awarded by the National Science Foundation. The Government has certain rights in the invention.

BACKGROUND

Passive components, such as inductors, are used in a variety of applications for telecommunication and power systems. When used in conjunction with an integrated circuit (IC) chip, inductors are generally mounted as separate components on a circuit board. Inductors may be integrated into the IC chips to reduce size, however the achievable inductances and/or Q factors of such integrated inductors are limited by the thin film based IC fabrication process.

BRIEF DESCRIPTION OF THE DRAWINGS

Many aspects of the present disclosure can be better understood with reference to the following drawings. The components in the drawings are not necessarily to scale, emphasis instead being placed upon clearly illustrating the principles of the present disclosure. Moreover, in the drawings, like reference numerals designate corresponding parts throughout the several views.

FIGS. 1A-1E are various views of examples of a power inductor in silicon (PIiS) with a pot-core shape in accordance with various embodiments of the present disclosure.

FIGS. 5A-5D are various views of a DC-DC converter including a PIiS of FIGS. 1A-1C in accordance with various embodiments of the present disclosure.

DETAILED DESCRIPTION

Figure 2:
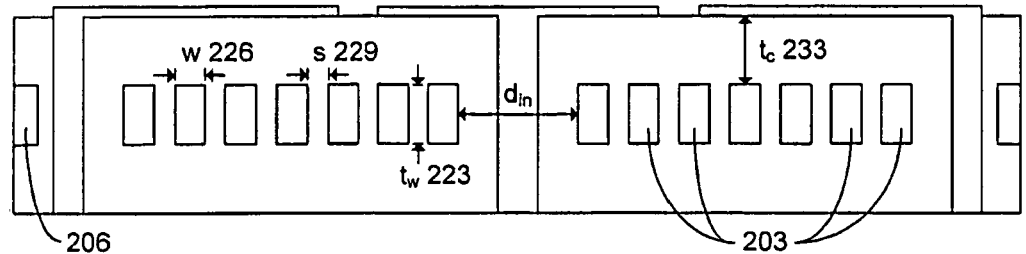
FIG. 2 is a cross-sectional view illustrating various dimensions of the PIiS of FIGS. 1A-1C in accordance with various embodiments of the present disclosure.

Disclosed herein are various embodiments of systems and methods related to power inductors in silicon (PIiS). Reference will now be made in detail to the description of the embodiments as illustrated in the drawings, wherein like reference numbers indicate like parts throughout the several views.

The present disclosure describes various embodiments of PIiS for use in compact systems such as power systems, as well as methods of fabricating the same. A PIiS is a power inductor integrated into a silicon substrate. The PIiS includes a magnetic core and one or more conductive windings that are embedded into the silicon substrate. The magnetic core may include a variety of shapes, such as but not limited to, a pot-core shape or a toroidal shape, as will be discussed in further detail below. In some embodiments, the PIiS includes a plurality of conductive windings embedded into the silicon substrate. The conductive windings may be copper, silver, or another appropriate metal or alloy. Further, the top and bottom of the silicon substrate may be capped with a magnetic material, for example a composite of magnetic powders and a polymer. The magnetic material fills in the spaces between at least a portion of the windings. Additionally, in some embodiments, solder balls are deposited on at least a portion of the windings, and the magnetic material also fills the spacing between the solder balls. In some embodiments, the PIiS may further include embedded conductive routing and through-wafer vias, and those embodiments of the PIiS may be used as a packaging substrate for surface-mounted capacitors and/or integrated circuits when constructing a compact system such as, e.g., a DC-DC power converter.

Referring now to FIGS. 1A-1C, illustrated are various perspectives of an embodiment of a PIiS 100 with a pot-core shape including a top view (FIG. 1A), an exploded view (FIG. 1B), and a cross-sectional view (FIG. 1C). The PIiS 100 includes one or more conductive windings 103 embedded in a silicon substrate 106. The conductive winding(s) 103 may be formed inside the silicon substrate 106 by electroplating. Electroplating molds may be created using deep reactive ion etch (DRIE) of the silicon. Silicon DRIE offers a high aspect ratio (e.g., about 20:1, about 10:1, or about 5:1), which allows the conductor of the conductive winding 103 to extend deeply into the silicon substrate 106. A high aspect ratio allows the width of the conductors of the conductive winding 103 to be minimized to its skin depth while maintaining a low alternating current (AC) and direct current (DC) resistance for the conductive winding 103. The conductive winding 103 may be a spiral winding as depicted in FIG. 1B or other winding configuration as appropriate. While the conductive winding 103 is shown as a circular spiral, other geometric configurations may be used such as, but not limited to, a hexagonal, octagonal, or rectangular spiral as illustrated in FIG. 1D. While a single conductive winding 103 is illustrated in FIGS. 1A-1C, more than one conductive winding 103 may be embedded in the silicon substrate 106. For example, multiple conductive windings 103 may be positioned adjacently in the silicon substrate 106.

A portion of the silicon surrounding the conductor of the conductive winding 103 may be removed and replaced with a magnetic material 109. Magnetic material 109 includes magnetic powders and/or magnetic composites. The magnetic materials 109 may be conductive magnetic materials and/or non-conductive magnetic materials. For conductive magnetic materials, an isolation layer is included between the conductive winding 103 and the magnetic material 109. An isolation layer may also be included between the silicon substrate 106 and metal of the conductive winding 103 and/or vias 116. The isolation layer may be a layer of a silicon such as, but not limited to, silicon dioxide ($SiO_2$) or a dielectric polymer such as, but not limited to, photoresist SU-8 and poly(dimethylsiloxane) (PDMS). Non-conductive magnetic materials include, but are not limited to, magnetic powder filled polymers.

In the implementation of FIGS. 1A-1C, the magnetic material 109 fills the spaces between turns of the conductive winding 103 and between the conductive winding 103 and the silicon substrate 106. The conductive winding 103 embedded in the silicon substrate 106 may also be covered on one or both sides by cap layers 113a and 113b of magnetic material 109. An isolation layer may also be included between the cap layers 113 and the conductive winding 103, the silicon substrate 106, and/or the magnetic material 109. In some implementations, a plurality of silicon substrates 106 including a conductive winding 103 may be bonded in a stack as illustrated in FIG. 1E. Each silicon substrate 106 is separated from an adjacent silicon substrate 106 by an intermediate layer 119 of magnetic material. An isolation layer may also be included between the intermediate layer 119 and the conductive windings 103, the silicon substrates 106, and/or the magnetic materials 109. In some embodiments, the stacked windings 103 may be interconnected to provide a desired level of inductance, while maintaining a small package footprint. Other winding configurations, such as a toroidal shape depicted in FIG. 7, may also be used.

The PIiS 100 also includes vias through the silicon and/or magnetic material to provide for connections to the conductive winding 103 and/or for routing through the PIiS 100. In FIGS. 1A-1C, through-wafer vias 116a and 116b extend through the silicon substrate 106 and both cap layers 113a and 113b to provide for connection to the conductive winding 103. In other embodiments, a via may extend through the silicon substrate 106 and only one of the cap layers 113a or 113b.

Referring next to FIG. 2, shown is a cross-sectional view of an embodiment of a PIiS 200 having a pot-core shape illustrating various dimensions of the PIiS 200. Parameters of the conductive winding 203 such as winding thickness ($t_w$) 223, conductor width (w) 226, number of turns (n), turn spacing (s) 229, etc. may be varied to provide a desired performance. The winding thickness 223 of the conductive winding 203 may be the same thickness as the silicon substrate (as illustrated in FIGS. 1A-1C) or may be a fraction of the thickness of the silicon substrate 206. For example, the winding thickness 223 and silicon substrate thickness may be in the range of about 100 μm to about 600 μm. In one implementation, the silicon substrate thickness is about 200 μm. The width 226 of a conductive winding 203 made of copper may be about 60 μm since the skin depth of the conductive winding 203 is about 30 μm at 6 MHz. Using an aspect ratio of 5 for the spacing results in a turn spacing 229 of about 40 μm. Other parameters of the PIiS 200 may be varied and/or optimized by simulation after the magnetic material is characterized to provide the desired operational characteristics. For example, the cap layer thickness ($t_c$) 233 and/or distribution of the magnetic material and silicon in the spaces between turns of the conductive winding 203 may be varied. Other aspect ratios and turn spacing may be used based upon the application and/or fabrication equipment employed.

Figure 3:
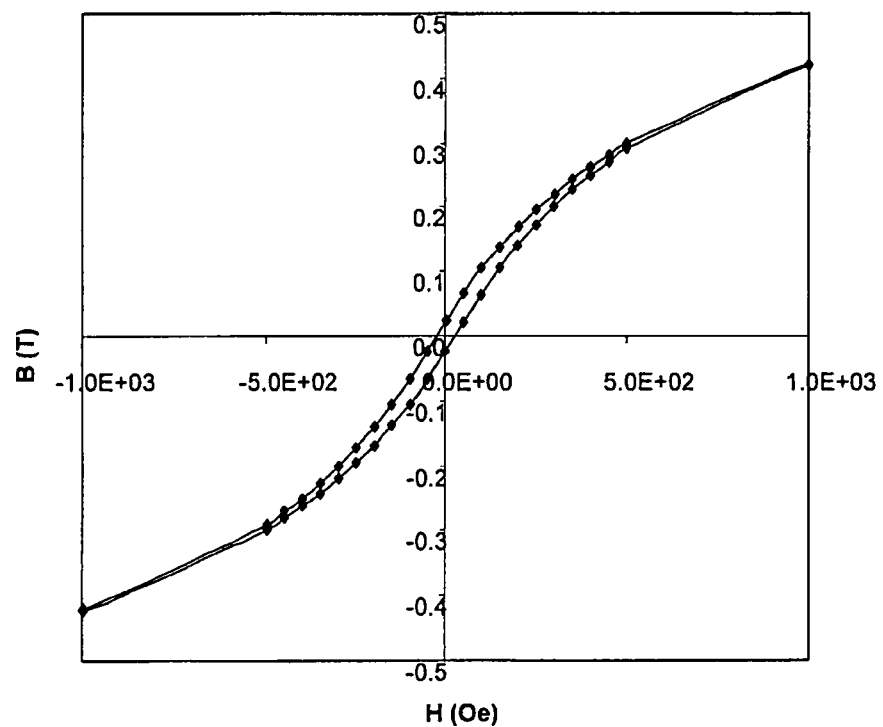
FIG. 3 is a graphical representation illustrating characteristics of magnetic material used in the PIiS of FIGS. 1A-1C in accordance with various embodiments of the present disclosure.

The magnetic material may include a composite of magnetic powder mixed with a bonder such as a polymer. Magnetic materials that may be utilized include, e.g., MnZn, Fe, NiFe, CoNiFe, etc. For example, the magnetic material may be a composite of a fully-sintered NiZn ferrite powder (e.g., FP350 from Powder Processing Technology, LLC) with about 89 wt % and Sylgard 184 PDMS (e.g., from Dow Corning) with about 11 wt %. In some embodiments, other magnetic materials may be used. Using a vibrating sample magnetometer (VSM), the permeability ($\mu_r$), coercive ($H_c$), and saturation flux density ($B_{sat}$) of the composite magnetic material were characterized as $\mu_r$=Oe, $H_c$=15 Oe and $B_{sat}$=0.2 T, respectively. FIG. 3 illustrates the B-H curve of the composite of fully-sintered NiZn ferrite powder and PDMS. By testing a hand-wound toroidal inductor with this composite magnetic material, the measured permeability at about 1 MHz to about 10 MHz was about 6.

Figure 4A:
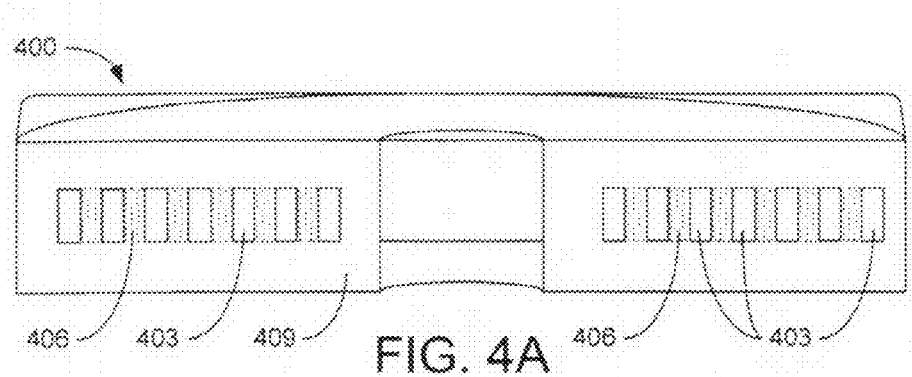
FIGS. 4A-4D are various views illustrating Maxwell simulations of magnetic flux within two examples of the PIiS of FIGS. 1A-1C in accordance with various embodiments of the present disclosure.
Figure 4B:
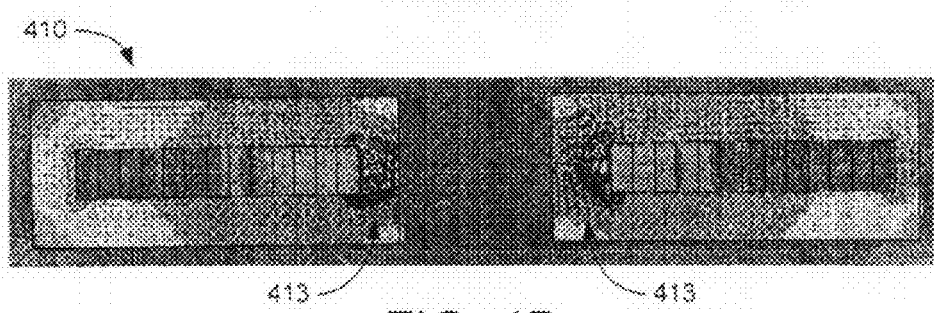

With reference to FIGS. 4A-4D, shown are cross-sectional views of two embodiments of a PIiS and corresponding Maxwell simulations of magnetic flux. The two PIiS embodiments illustrate the affect of magnetic material filling at least a portion of the spaces between turns of the conductive winding. To begin, FIG. 4A illustrates a cross-sectional view of a PIiS 400 including silicon 406 in the spacing between turns of the conductive winding 403. Magnetic material 409 is located around the conductive winding 403 and silicon 406 filling the spaces between turns. FIG. 4B illustrates a Maxwell simulation 410 of magnetic flux for the PIiS 400 depicted in FIG. 4A. The magnetic flux is highest at the central portion 413 of the magnetic material 409. The magnetic flux at the central portion 413 may be reduced by increasing the area of the magnetic core at the central portion 413. As illustrated in FIG. 4B, the magnetic flux between turns of the conductive winding 403 is very low.

Figure 4C:
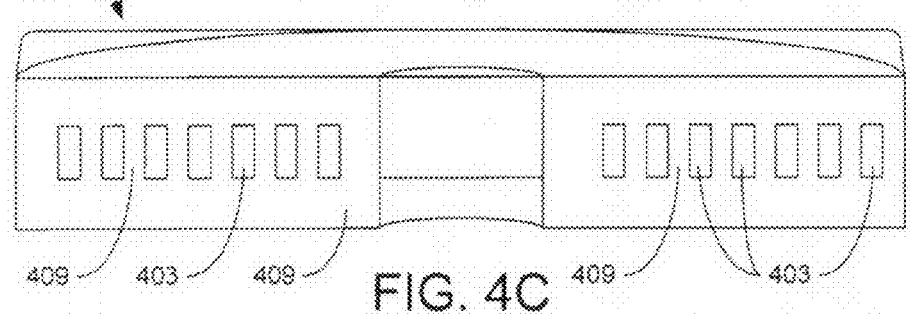
Figure 4D:
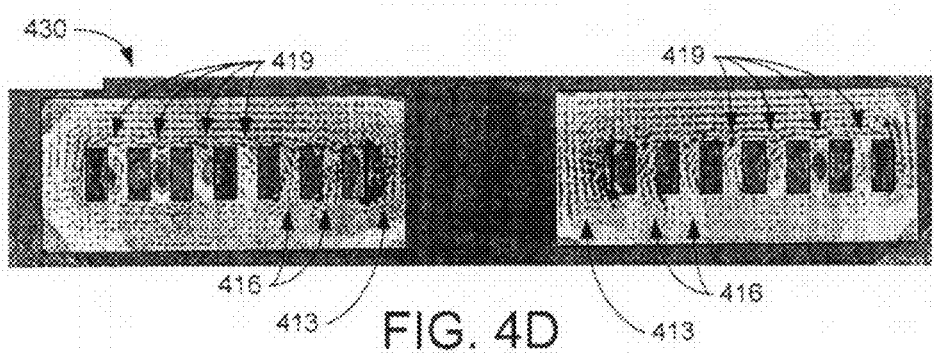

Next, FIG. 4C illustrates a cross-sectional view of a PIiS 420 including magnetic material 409 in the spacing between turns of the conductive winding 403 and FIG. 4D illustrates a Maxwell simulation 430 of magnetic flux for the PIiS 420 depicted in FIG. 4C. As in FIG. 4B, the magnetic flux is highest at the central portion 433 of the magnetic material 409. However, as illustrated in FIG. 4D, the magnetic flux 436 between turns of the conductive winding 403 is higher than in FIG. 4B. Based on the Maxwell simulation results depicted in FIGS. 48 and 4D, the inductance of the PIiS 420 with magnetic material 409 filling the spaces between turns is about 12% greater than that of the PIiS 400 with silicon 406 filling the spaces between turns of the conductive winding 403. With the pre-set parameters and the characterized magnetic material properties, the rest of the PIiS parameters may be optimized by simulation. For example, Table 1 provides parameters for one implementation of a PIiS using a composite of a fully-sintered NiZn ferrite powder and Sylgard 184 PDMS as the magnetic material. These parameters will be re-optimized if a different magnetic material is chosen.

In addition, it can be seen from the flux distribution of FIG. 4D that a similar effect may be produced by filling only a portion of the spaces between turns of the conductive winding 403 with magnetic material 409. Including magnetic material 409 in the first two inner spaces 416 of the conductive winding 403 increases the effective core area. Because of the lower magnetic flux levels in the four other spaces 419, the magnetic flux passing through these spaces 419 has a smaller effect on the inductance of the conductive winding 403 and, in some evaluations, may be ignored. Thus, filling of one or more of the four other spaces 419 with silicon 406 may be used to "fine tune" the inductance of a PIiS.

TABLE 1

| Parameters | Values |
|---|---|
| Number of turns (n) | 10 |
| Thickness of winding ($t_w$) | 200 µm |
| Width of winding conductor (w) | 60 µm |
| Spacing of winding turns (s) | 40 µm |
| Thickness of cap layer ($t_c$) | 200 µm |
| Inner diameter of winding ($d_{in}$) | 300 µm |
| Inductance (L) | 350 nH ($\mu_r = 5$) |
|  | 392 nH ($\mu_r = 6$) |
| Saturation current ($I_{sat}$) | >7 A |
| DC resistance ($R_{dc}$) | 117 mΩ |

Surface mounted electronic components such as integrated circuit (IC) chips and capacitors may be mounted directly to the PIiS for telecommunication and power conversion applications. For example, FIGS. 5A-5D illustrate a non-limiting embodiment of a compact DC-DC converter 500 including a PIiS 510 having a pot-core shape. FIG. 5A is a view of a silicon substrate 506 of the PIiS 510 including a conductive winding 503 and a magnetic core formed of magnetic material 509. While the conductive winding 503 is shown as a circular spiral, other geometric configurations may be used such as, but not limited to, a hexagonal, octagonal, or rectangular spiral. In addition, multiple conductive windings 503 may be included in the same silicon substrate 506. The magnetic core may be non-conductive for isolation of the conductive winding 503.

Vias 516 are included to allow for connection to the conductive winding 503 and for conductive routing 519 through the silicon substrate and/or magnetic material 509. The conductive routing may be copper, silver, or another appropriate metal or alloy. Similarly, the vias may be filled with copper, silver, or another appropriate metal or alloy to provide a conductive path. A conductive ring 523 may also be added to the silicon substrate 506 to provide a mechanical frame, enhance the mechanical robustness, and help dissipate heat. The conductive ring 523 may also be used as an electrical ground connection. The conductive ring 523 may include copper, silver, or other metal or alloy as appropriate. In some embodiments, the through-wafer vias 516 and the conductive ring 523 are formed along with the conductive winding 503 without any additional process steps.

Referring next to FIGS. 5B-5D, shown are cross-sectional, top and bottom views of the compact DC-DC converter 500, respectively. The compact DC-DC converter 500 includes surface mounted capacitors 526 and a power integrated circuit chip 529 mounted directly on the top surface of the PIiS 510 by, e.g., flip-chip bonding. Including through-wafer vias 516 and conductive routings 519 during fabrication of the PIiS 510 allows for connection of the surface mounted components with no wire bonding being utilized. While the embodiment of FIGS. 5B-5D includes conductive routings 519 on the top surface of the PIiS 510, other implementations may also include conductive routings 519 formed on the bottom surface or between the silicon substrate 506 and the cap layer(s) 513. Vias (e.g., 516a) may extend through the PIiS 510 or vias (e.g., 516b) may only extend partially through the PIiS 510.

In one implementation, the power integrated circuit chip 529 is a TPS62601 chip (a high-frequency synchronous step-down DC-DC converter from Texas Instruments, measuring about 1.3×0.9×0.6 mm³), and the two surface mounted capacitors 526 are 4.7 µF and 2.2 µF, respectively. The power integrated circuit chip 529 and the two surface mounted capacitors 526 may be mounted on the top of a PIiS 510 in the compact DC-DC converter 500 as illustrated in FIGS. 5B-5D. The power integrated circuit chip 529 can output 500 mA, 1.8 V power at 6 MHz. Based on these specifications, the targeted inductance, DC resistance and size of the PIiS 510 are about 0.3 µH to about 0.5 µH, about 120 mΩ and about 3×3×0.6 mm³, respectively.

Figure 6A:
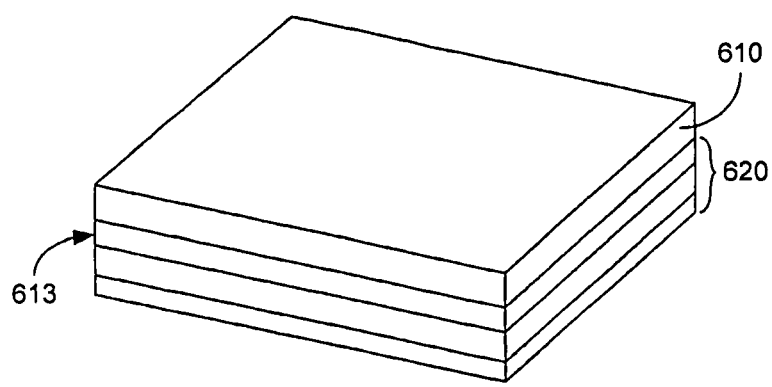
FIGS. 6A-6B are various views of integrated circuit (IC) chips fabricated on a PIiS of FIGS. 1A-1C in accordance with various embodiments of the present disclosure.
Figure 6B:
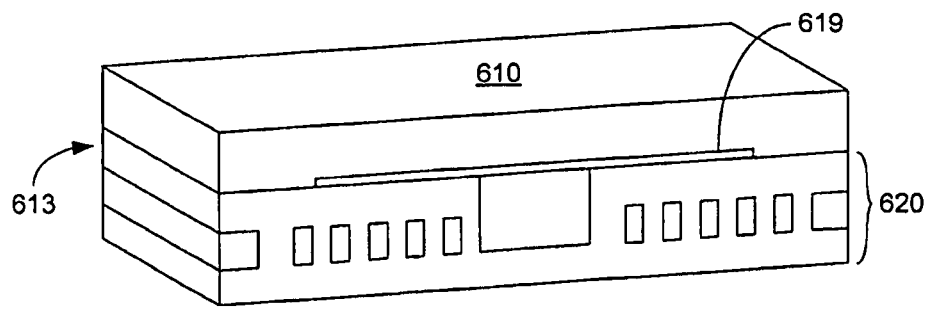

In other embodiments, integrated circuit chips for telecommunication and power conversion applications may be fabricated on a PIiS using wafer-level packaging. FIG. 6A shows a perspective view of a non-limiting example of an IC chip 610 fabricated on the top surface of a PIiS 620. FIG. 6B illustrates a cross-sectional view of the IC chip 610 on the PIiS 620. The IC chip 610 may be bonded to the PIiS 620 at the wafer level. For example, a compact DC-DC converter may be implemented using the IC chip 610. In other implementations, the IC chip 610 may be fabricated directly on the PIiS 620. Vias and conductive routing 619 may be provided between the IC chip 610 and cap layer 613 to provide connections to the PIiS 620. In addition, the bulk silicon substrate of the IC chip 610 may be thinned by polishing, since the PIiS 620 can serve as the supporting substrate for the IC chip 610 after wafer bonding.

Figure 7A:
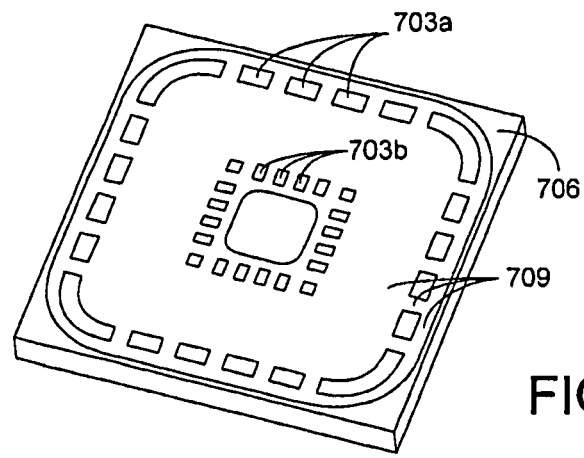
FIGS. 7A-7C are various views of an example of a PIiS with a torodial core shape in accordance with various embodiments of the present disclosure.
Figure 7B:
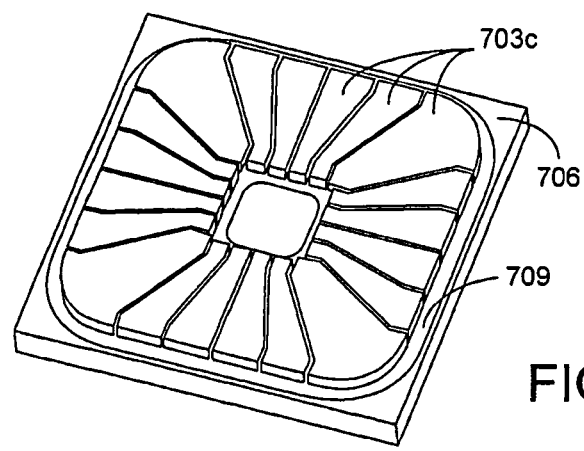
Figure 7C:
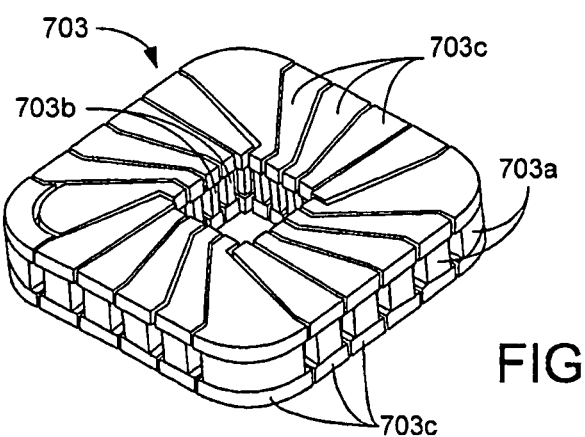

Referring now to FIGS. 7A-7C, shown are views of an embodiment of a PIiS having a toroidal core shape. The PIiS includes one or more conductive windings 703 that have a toroidal shape, which is embedded in a silicon substrate 706. While a single conductive winding 703 is illustrated in FIGS. 7A-7C, more than one conductive winding 703 may be embedded in the silicon substrate 706. FIG. 7A is a view of the silicon substrate 706 of the PIiS. Outer portions 703a of the conductive winding 703 and inner portions 703b of the conductive winding 703 may be formed inside the silicon substrate 706 by electroplating. Electroplating molds may be created using deep reactive ion etch (DRIE) of the silicon. Silicon DRIE offers a high aspect ratio (e.g., about 20:1), which allows the outer and inner portions (703a and 703b, respectively) of the conductive winding 703 to extend through the silicon substrate 706.

A portion of the silicon surrounding the conductor of the conductive winding 703 may be removed and replaced with a magnetic material 709 to form a magnetic core. Magnetic material 709 may be conductive or non-conductive and includes magnetic powders and/or magnetic composites. An isolation layer is included when conductive magnetic material is used. In the implementation of FIGS. 7A-7C, the magnetic material 709 fills the spaces between turns of the conductive winding 703 and between the conductive winding 703 and the silicon substrate 706. As illustrated in FIG. 7B, top and bottom portions 703c of the conductive winding 703 are formed over outer and inner portions (703a and 703b, respectively) of the conductive winding 703 and the magnetic material 709 to complete the toroidal configuration of the conductive winding 703. In some implementations, the top and bottom portions 703c of the conductive winding 703 may be fabricated on separate wafers and bonded to the outer portions 703a and inner portions 703b of the conductive winding 703. Leakage losses of the conductive winding 703 may be reduced by covering the magnetic material 709 as much as possible with the conductors of the conductive winding 703, as illustrated in FIGS. 7B and 7C.

The top and bottom portions 703c of the conductive winding 703 may also be covered on one or both sides by cap layers of magnetic material 709. Isolation layers may be included between the top and bottom portions 703c of the conductive winding 703 and the magnetic material 709 of the magnetic core and/or the cap layers. The PIiS may also include vias through the silicon and/or magnetic material to provide for connections to the conductive winding 703 and/or for routing through the PIiS. FIG. 7C is a schematic view of the conductive winding 703 of the PIiS having a toroidal core shape.

Figure 8A:
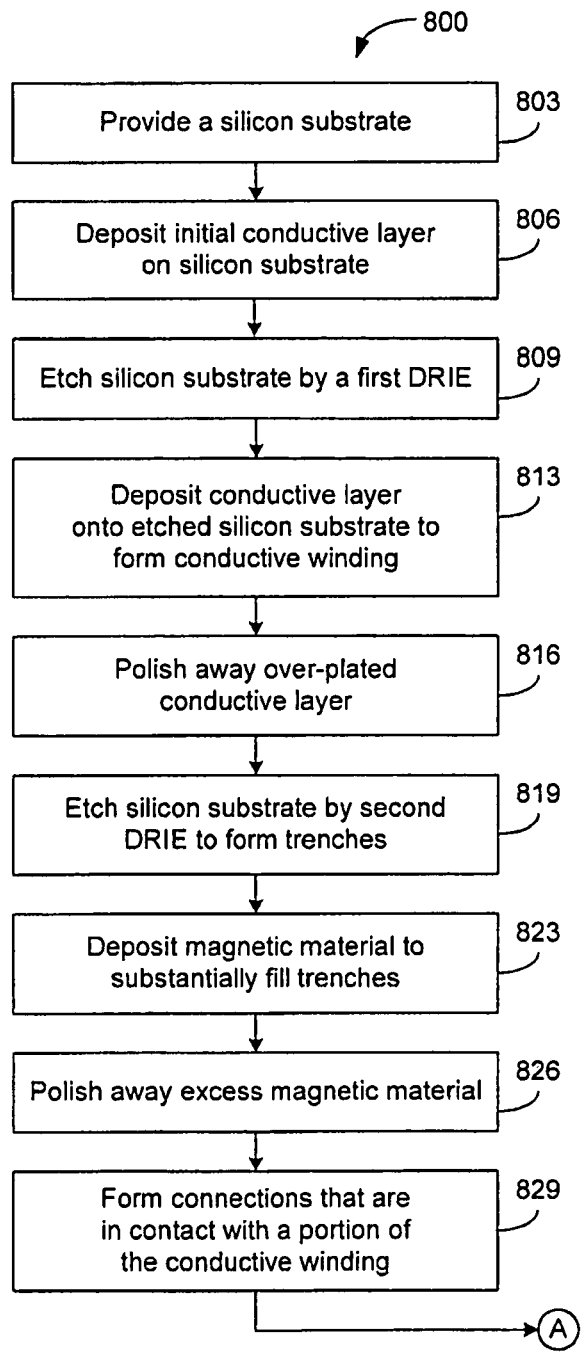
FIGS. 8A-8B are a flow chart illustrating the fabrication of a PIiS of FIGS. 1A-1C and 7A-7C in accordance with various embodiments of the present disclosure.
Figure 8B:
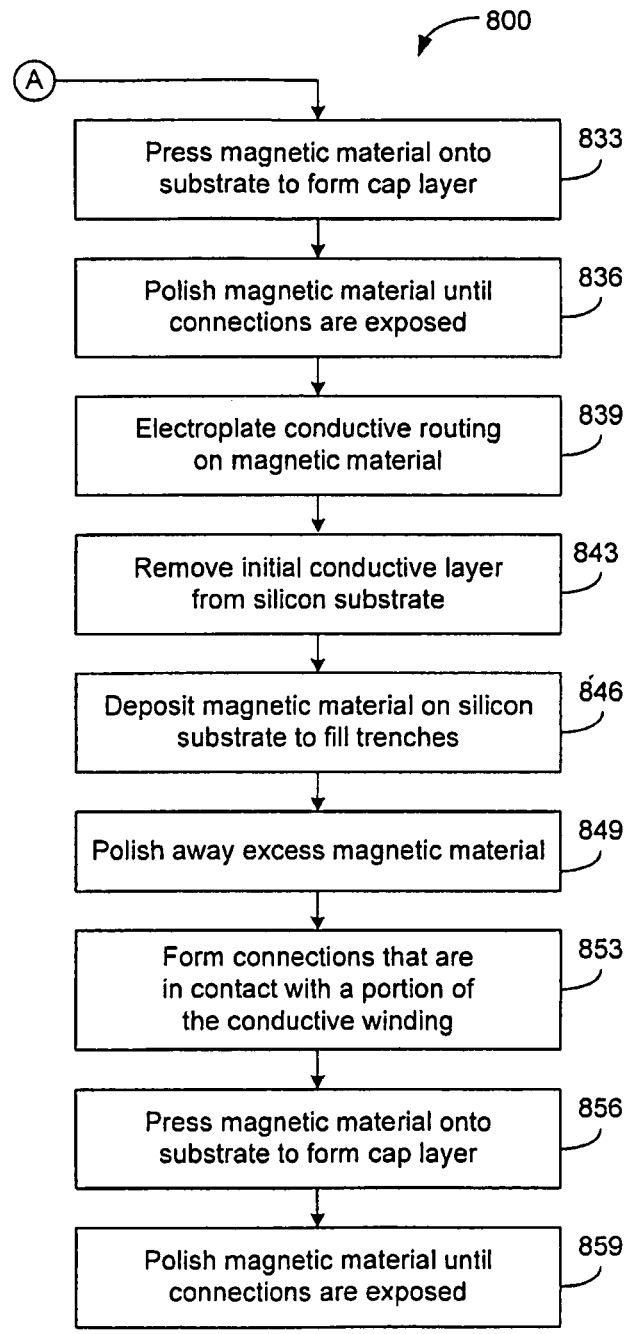

Referring next to FIGS. 8A and 8B, shown is a flow chart 800 of a non-limiting example of fabrication of a PIiS. In addition, FIGS. 9A-9G illustrate cross-sectional views of an embodiment of a PIiS 900 at various stages during fabrication and will be discussed in connection with the flow chart 800 of FIGS. 8A and 8B.

Beginning with block 803, a silicon substrate (e.g., silicon substrate 906 of FIG. 9A) is provided. The silicon substrate 906 may have a thickness in the range of about 100 µm to about 600 µm thick, about 100 µm to about 500 µm thick, and about 200 µm to about 400 µm thick. In some embodiments, the silicon substrate 906 is about 200 µm thick. In block 806, an initial conductive layer 919 (FIG. 9A) is deposited on a bottom surface of the silicon substrate 906. The initial conductive layer 919 may be disposed on the silicon substrate 906 using electroplating or other appropriate methods such as, but not limited to, screen painting, evaporation, sputtering, etc. For example, a 10 µm layer of copper may be deposited on the bottom surface of a silicon substrate 906. A layer of titanium (Ti) (e.g., about 50-100 Å thick) and a layer of copper (Cu) (e.g., about 1000-2000 Å thick) may be sputtered on the silicon substrate 906 as a diffusion barrier and to promote adhesion before electroplating the 10 µm layer of copper. The conductive layer serves as a seed layer for future processing. Additionally, the conductive layer provides mechanical support for the silicon walls during device fabrication.

Figure 9A:
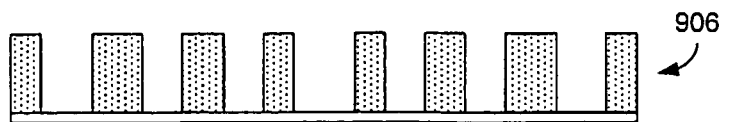
FIGS. 9A-9G and 10 are cross-sectional views illustrating the fabrication of a PIiS of FIGS. 1A-1C and 7A-7C in accordance with various embodiments of the present disclosure.
Figure 9B:
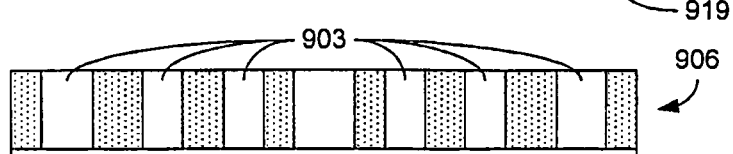

The top of the silicon substrate 906 is etched to create molds (e.g., deep or through-substrate trenches) for one or more conductive winding(s) by a first deep reactive ion etch (DRIE) in block 809. In the example of FIG. 9A, molds are trenches etched through the silicon substrate 906 to the initial conductive layer 919. In block 813, a conductive layer is deposited onto the etched silicon substrate 906 by electroplating or electroless plating to fill the molds as illustrated in FIG. 9B. The electroplated conductive layer forms the conductors of the conductive winding(s) 903 (FIG. 9). The electroplated conductive layer may also fill vias passing through the silicon substrate 906. In block 816, the over-plated conductive layer is polished away using, e.g., chemical-mechanical polishing (CMP), as illustrated in FIG. 9B.

Figure 9C:
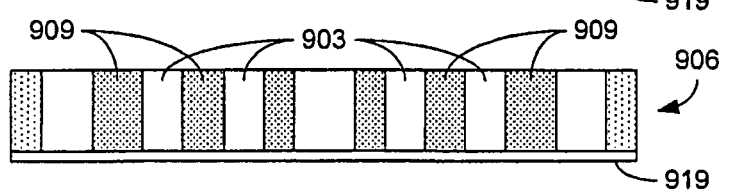

In block 819, the silicon substrate 906 is etched by a second DRIE. The second DRIE forms deep or through-substrate trenches in the silicon substrate 906. For example, the second DRIE may remove a portion of the silicon substrate in the spaces between turns of the conductive winding 903 and/or a portion of the silicon substrate between the conductive winding 903 and the silicon substrate 906. A magnetic material 909 is deposited in the trenches formed in the silicon substrate 906 in block 823, as illustrated in FIG. 9C. The magnetic material 909 may be deposited by hot pressing in a vacuum chamber, by electroplating, by spin-on, or by painting. The magnetic material 909 substantially fills in the trenches formed in the silicon substrate 906 by the second DRIE. In some embodiments, the magnetic material 909 may be compacted or compressed for uniform distribution of the magnetic material 909 within the trenches. For good adhesion, the silicon substrate 906 including the trenches may be surface activated by oxygen plasma before filling with the magnetic material 909. After filling, the silicon substrate 906 may be placed in a vacuum chamber (e.g., less than about 10 Torr for about 30 minutes) to remove air bubbles and heated (e.g., at about 100° C. for about 20 minutes) to solidify the composite. In block 826, excess magnetic material (i.e., overfill) that is over the trenches in the silicon substrate 906 is polished away using, e.g., CMP. FIG. 9C illustrates a cross-sectional view of the structure after the overfill of the magnetic material is polished away.

As can be understood, in some implementations, the order of flow chart 800 may be changed. For example, the magnetic material 909 may be deposited and polished after the first DRIE in block 809 and the conducive layer may be deposited and polished after the second DRIE in block 819, thus reversing the positioning of blocks 813/816 and blocks 823/826. In other implementations, a DRIE etches a silicon substrate 906. A conductive layer is deposited onto the etched substrate 906 to form the conductive winding 903 and magnetic material 909 is subsequently deposited to fill at least a portion of the space between turns of the conductive winding 903. In alternative embodiments, the magnetic material 909 is deposited in trenches before forming the conductive winding 903 in the silicon substrate 906.

Figure 9D:
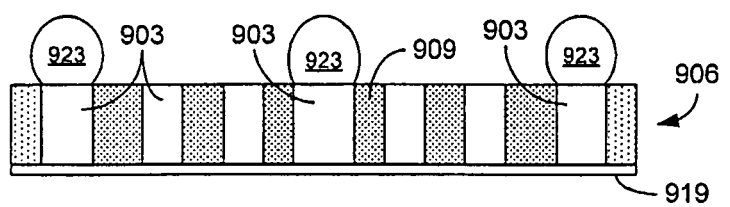
Figure 9E:
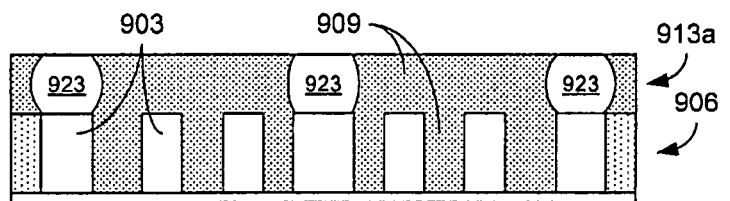

In block 829, one or more winding connections (or conductive posts) are formed in contact with a portion of the conductive winding 903. In the implementation of FIG. 9D, a first plurality of solder balls 923 are deposited on the top of the structure with silver epoxy as the bonder. In alternative embodiments, a different bonder may be used. The solder balls 923 are deposited so as to contact at least a portion of the exposed conductor and/or a connection pad of the conductive winding 903. In some embodiments, the solder balls 923 are about 300 µm in diameter. In other embodiments, the winding connections may be posts formed by electroplating with copper, silver, or other metal.

Figure 9F:
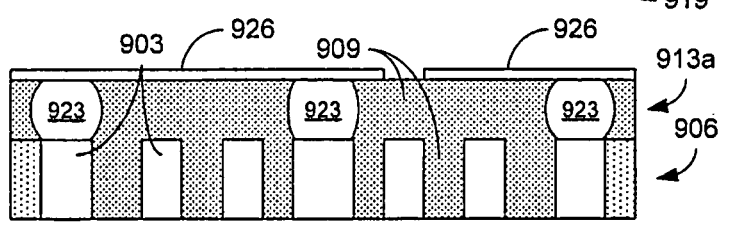

In block 833, a first cap layer 913a (FIG. 9E) is formed by pressing the magnetic material 909 on the structure. In some implementations, an isolation layer may be provided over the conductive winding 903, the magnetic material 909, and/or the winding connections before adding the magnetic material. The magnetic material 909 is polished using, e.g., CMP in block 836 until the winding connections (e.g., the first plurality of solder balls 923) are exposed resulting in the structure illustrated in FIG. 9E. In block 839, one or more conductive routing(s) 926 may be electroplated on the magnetic material 909 as illustrated in FIG. 9F. The conductive routing(s) may be copper, silver, or other metal. In some embodiments, the conductive routing layer may be about 20 µm thick.

In block 843, the initial conductive layer 919 on bottom of the silicon substrate 906 is etched away. In block 846, magnetic material 909 is deposited on the bottom silicon substrate 906 and fills in the trenches formed by the first DRIE. Excess magnetic material (i.e., overfill) over the trenches is polished away in block 849 as illustrated in FIG. 9F.

Figure 9G:
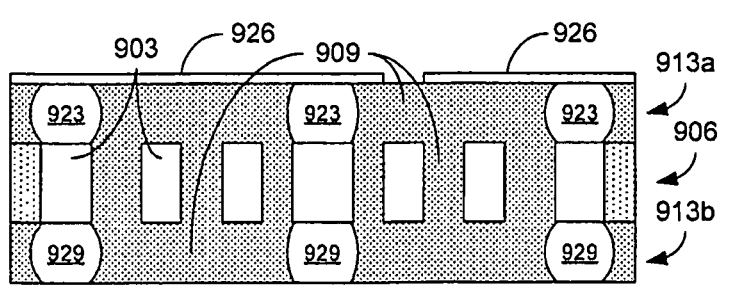

In block 853, one or more winding connections (or conductive posts) may be formed in contact with a portion of the conductive winding 903. In the implementation of FIG. 9G, a second plurality of solder balls 929 are deposited on the bottom of the structure with silver epoxy as the bonder. In alternative embodiments, a different bonder is used. The solder balls 923 are deposited so as to contact at least a portion of the exposed conductor and/or a connection pad of the conductive winding 903. In some embodiments, the solder balls 923 are about 300 µm in diameter. In other embodiments, the winding connections may be posts formed by electroplating with copper, silver, or other metal.

In block 856, a second cap layer 913b may be formed by pressing magnetic material 909 on the bottom of the structure.

The magnetic material 909 is polished in block 859 until the winding connections (e.g., the second plurality of solder balls 929) are exposed resulting in a PIiS structure illustrated in the cross-sectional view of FIG. 9G.

In the case of a PIiS including a torodial conductive winding 703 (FIGS. 7A-7C), the outer and inner portions (703a and 703b) of the conductive winding 703 may be formed inside the silicon substrate 706 as discussed with respect to blocks 803 to 826 as illustrated in FIG. 7A. Top portions 703c of the conductive winding 703 are formed by electroplating over the outer and inner portions (703a and 703b) of the conductive winding 703 and the magnetic material 709 as illustrated in FIGS. 7B and 7C. Connection(s), a first cap layer, and/or conductive routing(s) may be formed over the top portions 703c of the conductive winding 703 as discussed with respect to blocks 829-839.

The conductive layer may be removed and the bottom of the silicon substrate prepared as discussed with respect to blocks 843-849. Bottom portions 703c of the conductive winding 703 are formed by electroplating over outer and inner portions (703a and 703b) of the conductive winding 703 and the magnetic material 709. Connection(s) and/or a second cap layer may be formed over the bottom portions 703c of the conductive winding 703 as discussed with respect to blocks 853-859 to provide the PIiS.

Figure 10:
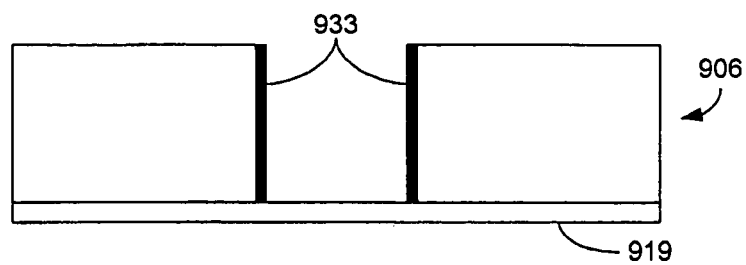

In some implementations, an isolation layer may be included between the conductive winding 903, the magnetic material 909, and/or the silicon substrate 906. Referring to FIG. 10, shown is a cross-sectional view of the silicon substrate 906 including a through-substrate trench (or mold) with an isolation layer 933. The isolation layer 933 may be a layer of silicon (e.g., $SiO_2$) or a polymer (e.g., SU-8 or PDMS) deposited on the sidewalls of the trench to serve as a dielectric barrier between the conductive winding 903, the magnetic material 909, and/or the silicon substrate 906. The initial conductive layer 919 is exposed at the bottom of the trench to provide a seed layer for electroplated metal of the conductive winding 903 and/or electroplated magnetic material 909 (e.g., NiFe or CoNiFe). In other implementations, the isolation layer 933 may be a layer of non-conductive magnetic material 909 (e.g., a composite of polymer and magnetic powder) or the combination of a silicon or polymer layer and a layer of non-conductive magnetic material 909.

Referring back to the flow chart 800 of FIG. 8A, a silicon substrate 906 (FIG. 10) is provided in block 803 and an initial conductive layer 919 (FIG. 10) is deposited on a bottom surface of the silicon substrate 906 in block 806. For example, about 100 Å of Ti and about 1000 Å of Cu may be sputtered on the backside of the silicon substrate 906 as a diffusion barrier and adhesion promotion layer before electroplating a 10 μm layer of copper as the initial conductive layer 919. The top of the silicon substrate 906 is etched to create trenches (or molds) by a first DRIE in block 809. Photoresist may be coated and patterned to define the trenches formed by the first DRIE.

The isolation layer 933 (FIG. 10) may then be formed by a layer of silicon deposited conformally on the sidewalls of the trenches. For example, $SiO_2$ may be deposited using plasma enhanced chemical vapor deposition (PECVD) to form an isolation layer 933 that is, e.g., about 0.6 μm thick. The $SiO_2$ on the bottom of the trench can be removed by anisotropic oxide etching to expose the initial conductive layer 919 while leaving the $SiO_2$ on the trench sidewalls. A negatively sloping sidewall (i.e., a narrower opening at the top of the trench than at the bottom of the trench) reduces exposure of the $SiO_2$ on the trench sidewalls to the highly directional ions during the anisotropic oxide etching. In block 813, material of the conductive winding 903 may be electroplated in the trenches as illustrated in FIG. 9B. In other implementations, magnetic material 909 may be electroplated in the trenches (e.g., in block 823). The over-plated portion is removed in block 816 (or block 826) by, e.g., chemical-mechanical polishing (CMP).

In alternate implementations, initially trenches are formed as molds for a polymer isolation layer 933. The initially formed trenches are filled with the polymer (e.g., SU-8 or PDMS) and the over-fill is removed by CMP. For example, the trenches may be filled with SU-8 (or SU-8 diluted with Thinner P to reduce viscosity) and heated (e.g., to about 60° C. for about 30 minutes) to removed trapped bubbles in the trenches. The silicon substrate 906 with the polymer isolation layers 933 may then be pre-baked at about 90° C. for about 60 minutes (with a temperature ramp of about a 4° C./min from about 60° C. to about 90° C.) and allowed to slowly cool down. The polymer is exposed to a dose of about 540 mJ/cm² under a 365 nm UV light followed by a post-bake at about 90° C. for about 45 minutes (with a temperature ramp of about a 4° C./min from about 60° C. to about 90° C.) and a slow cool down. The silicon substrate 906 may be polished until the polymer is removed from the top surface.

The silicon between the polymer isolation layers 933 may then be removed by DRIE to create molds (e.g., through-substrate trenches) for depositing the material of the conductive winding 903 (e.g., in block 813) and/or depositing the magnetic material 909 (e.g., in block 823). Silicon residues on the polymer isolation layer 933 after the DRIE may be removed by a short isotropic silicon dry etching. Over-fill material may be removed by polishing (e.g., in block 816 or block 826).

A PIiS has been experimentally verified. Specifically, an embodiment of a PIiS for use in a buck converter a step down DC-DC converter) was fabricated on a die measuring about 3×3×0.6 mm³. The PIiS included a conductive winding having a pot-core shape as illustrated in FIG. 5A. Table 1 provides parameters for the experimentally verified implementation of the PIiS. The tested results (FIGS. 11-13) matched the simulated results of Table 1. The fabricated PIiS was mounted on a testing printed circuit board (PCB) with solder balls and silver epoxy; and then an integrated circuit chip and surface mounted capacitors were mounted on the top of the PIiS, both by flip-chip bonding, in a fashion similar to that illustrated in FIG. 5C. The DC resistance ($R_{DC}$) of the fabricated PIiS in the buck converter was measured using a 4-probe station. The measured $R_{DC}$ was 140 mΩ, which was higher than the expected value of 117 mΩ shown in Table 1. This difference between the measured $R_{DC}$ and the calculated $R_{DC}$ may be due to a reduction in the thickness of the conductive winding resulting from the multi-polishing steps and over etching during removal of the bottom conductive seed layer. Additionally, the difference in measured and calculated $R_{DC}$ may be due to the resistivity of the layer of copper, which is higher than the resistivity of ideal copper, that is electroplated on the substrate to form the conductive winding.

Figure 11:
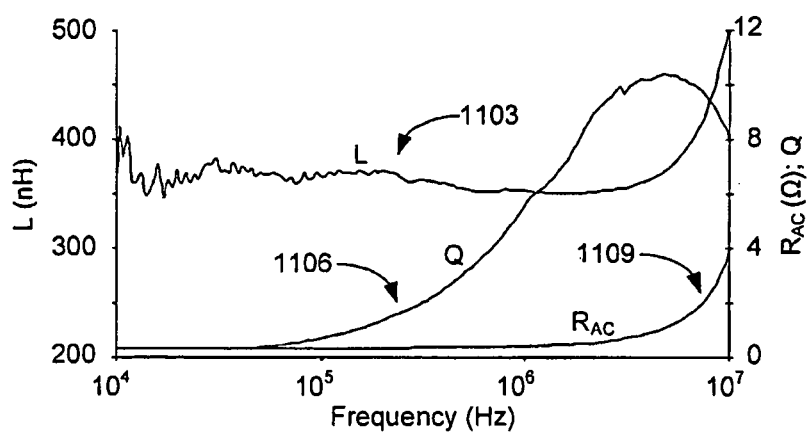
FIGS. 11-13 are graphical representations illustrating the performance of a PIiS of FIGS. 1A-1C and a DC-DC converter including the PIiS in accordance with various embodiments of the present disclosure.

Referring to FIG. 11, shown are the measured frequency dependence of the inductance (L) 1103, quality factor (Q) 1106, and AC resistance ($R_{AC}$) 1109 of the fabricated PIiS in the buck converter were also measured. The measured L 1103, Q 1106, and $R_{AC}$ 1109 are plotted with respect to frequency in Hertz. As can be seen in FIG. 11, at about 6 MHz, the measured L 1103 is about 390 nH, the measured Q 1106 is about 10, and the measured $R_{AC}$ 1109 is about 1.13 Ω.

Figure 12:
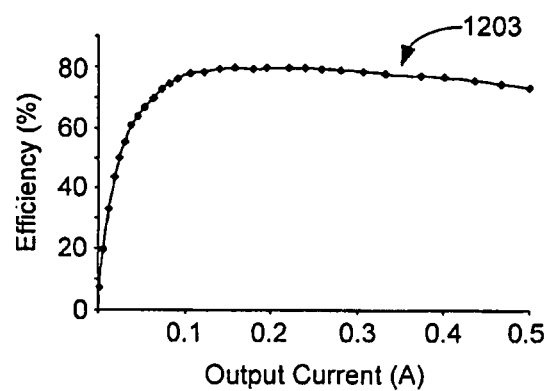
Figure 13:
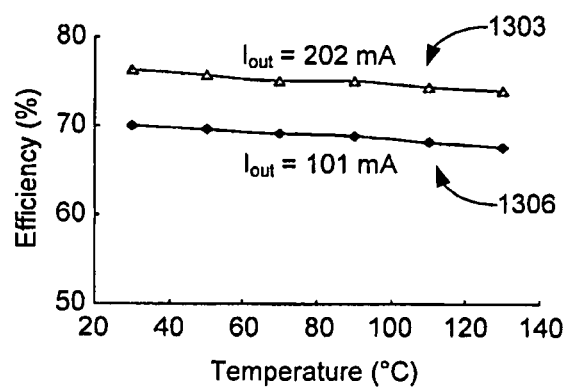

Additionally, the efficiency of the fabricated PIiS in the buck converter was also measured. FIG. 12 illustrates the efficiency (%) 1203 of the fabricated PIiS in the buck converter with respect to the output current (A), with an input voltage ($V_{in}$) of about 3.6 V and an output voltage ($V_{out}$) of about 1.8 V. As can be seen in the plot of FIG. 12, the measured peak efficiency 1203 of the fabricated PIiS in the buck converter is about 80%. The efficiency of the implemented buck converter only drops about 2% over a 100° C. temperature increase as illustrated in FIG. 13. Plots 1303 and 1306 illustrate the efficiency (%) with respect to the temperature of the buck converter using the fabricated PIiS at output currents of 202 mA and 101 mA, respectively.

During evaluation, the fabricated PIiS in the buck converter achieved a Q of 10, a resistance of about one ohm (1Ω), and a bandwidth up to 10 MHz. A compact buck converter based on a PIiS, in which the built-in through-wafer vias serve as signal paths and thermal plugs, has also been successfully demonstrated.

Since the described PIiS may be batch fabricated, a PIiS can be more cost effective than a power system in packaging (PSiP), which includes integrated circuits stacked with power inductors inside a package. Moreover, since the fabrication of the PIiS includes large tolerances for each step and few steps are involved in fabricating a PIiS, a PIiS may be easy to fabricate. Also, a PIiS that is surface mounting compatible and can be fabricated at wafer level may lead to further reductions in manufacturing costs. Additionally, since the fabrication of a PIiS, such as that illustrated by flow chart 800 of FIG. 8, can be performed at a relatively low temperature, the fabrication the PIiS will not adversely affect other integrated circuits.

In addition, the PIiS is compact because most of the space in the PIiS is utilized for the conductive windings, the magnetic core, the winding connections, and a heat sink. Accordingly, the PIiS may be implemented in portable electronics where smaller and less expensive power systems are useful. Although a PSiP generally has large power handling capability up to tens of amperes and high Q of over 10 even at MHz, the size reduction of a PSiP is limited in contrast to a PIiS.

Also, in contrast to a power system on a chip (PSoC), which includes a thin film inductor, a PIiS has a greater inductance and a higher Q than the PSoC. Further, a PIiS has lower DC loss. Since the substrate-molded conductors of the PIiS may be as thick as the silicon substrate (e.g., in the range of about 200-500 μm) and may have large cross-sectional areas, the PIiS may have a low DC winding resistance.

A DC-DC converter including a PIiS may also have various improvements over existing DC-DC converters. For example, a DC-DC converter may be less expensive to fabricate because system integration may be realized using wafer-to-wafer bonding or flip-chip bonding. Further, since a PIiS may serve as a packaging substrate, no additional packaging substrate or lead frames are necessary for a DC-DC converter including a PIiS. Moreover, because through-wafer vias may provide interconnections, no wire bond is needed in a DC-DC converter including a PIiS. Those through-wafer metals may provide thermal paths to help dissipate heat from the integrated chip in, e.g., a DC-DC converter as well as from the power inductor. Additional metal plugs may be electroplated at the same time as the through-wafer metals, eliminating extra process steps due to fabrication of metal plugs. Furthermore, since the PIiS and integrated circuits may be manufactured by the same semiconductor foundry, further savings in manufacturing a DC-DC converter including a PIiS may be realized.

It should be emphasized that the above-described embodiments of the present disclosure are merely possible examples of implementations set forth for a clear understanding of the principles of the disclosure. Many variations and modifications may be made to the above-described embodiment(s) without departing substantially from the spirit and principles of the disclosure. All such modifications and variations are intended to be included herein within the scope of this disclosure and protected by the following claims.

It should be noted that ratios, concentrations, amounts, and other numerical data may be expressed herein in a range format. It is to be understood that such a range format is used for convenience and brevity, and thus, should be interpreted in a flexible manner to include not only the numerical values explicitly recited as the limits of the range, but also to include all the individual numerical values or sub-ranges encompassed within that range as if each numerical value and sub-range is explicitly recited. To illustrate, a concentration range of "about 0.1% to about 5%" should be interpreted to include not only the explicitly recited concentration of about 0.1 wt % to about 5 wt %, but also include individual concentrations (e.g., 1%, 2%, 3%, and 4%) and the sub-ranges (e.g., 0.5%, 1.1%, 2.2%, 3.3%, and 4.4%) within the indicated range. The term "about" can include traditional rounding according to significant figures of numerical values. In addition, the phrase "about 'x' to 'y'" includes "about 'x' to about 'y'".

Therefore, at least the following is claimed:

1. A power inductor in silicon, comprising:
  a magnetic core of magnetic material embedded in a silicon substrate, the magnetic material including a composite of magnetic powder mixed with a polymer; and
  a conductive winding having a plurality of turns, where adjacent turns of the conductive winding have a space therebetween, where at least a portion of the space between adjacent turns of the conductive winding is filled with the magnetic material of the magnetic core, and where at least a portion of the magnetic core is encircled by the conductive winding.

2. The power inductor in silicon of claim 1, wherein at least a portion of the space between adjacent turns of the conductive winding is filled with silicon.

3. The power inductor in silicon of claim 1, wherein the magnetic material is a composite including a fully-sintered NiZn ferrite powder and the polymer.

4. The power inductor in silicon of claim 1, wherein the conductive winding is copper.

5. The power inductor in silicon of claim 1, further comprising a conductive ring encircling the conductive winding and the magnetic material.

6. The power inductor in silicon of claim 1, further comprising a cap layer of magnetic material on at least one side of the silicon substrate, the cap layer disposed on at least one side of the conductive winding and the magnetic core.

7. The power inductor in silicon of claim 6, wherein the magnetic material of the cap layer is a composite magnetic material.

8. The power inductor in silicon of claim 1, further comprising a plurality of winding connections, each winding connection in contact with a portion of the conductive winding.

9. The power inductor in silicon of claim 8, wherein the plurality of winding connections include a first plurality of solder balls, each solder ball deposited on a portion of the conductive winding exposed on a first side of the silicon substrate.

10. The power inductor in silicon of claim 9, wherein the plurality of winding connections further includes a second plurality of solder balls, each solder ball deposited on a portion of the conductive windings exposed on a second side of the silicon substrate.

11. The power inductor in silicon of claim 8, wherein the plurality of winding connections includes electroplated copper posts.

12. The power inductor in silicon of claim 8, wherein a cap layer of magnetic material fills in spaces between the plurality of the winding connections.

13. The power inductor in silicon of claim 8, wherein the plurality of winding connections includes a plurality of solder balls.

14. A DC to DC converter, comprising:
a power inductor in silicon including:
a magnetic core of magnetic material embedded in a silicon substrate, the magnetic material including a composite of magnetic powder mixed with a polymer;
a conductive winding having a plurality of turns, where adjacent turns of the conductive winding have a space therebetween, where at least a portion of the space between adjacent turns of the conductive winding is filled with the magnetic material of the magnetic core, and where at least a portion of the magnetic core is encircled by the conductive winding; and
a cap layer of magnetic material disposed on at least one side of the silicon substrate; and
an integrated circuit mounted on the cap layer of the power inductor in silicon, the integrated circuit communicatively coupled to the conductive winding.

15. The DC to DC converter of claim 14, wherein the magnetic core has a pot-core shape.

16. The DC to DC converter of claim 14, wherein the magnetic core has a torodial shape.

17. The DC to DC converter of claim 14, wherein the integrated circuit includes an integrated circuit chip and at least one capacitor mounted on the cap layer of the power inductor in silicon.

18. The DC to DC converter of claim 14, wherein the integrated circuit is communicatively coupled to the conductive winding by a plurality of winding connections extending through the cap layer, each winding connection in contact with a portion of the conductive winding.

19. The DC to DC converter of claim 18, wherein the plurality of winding connections includes solder balls, each solder ball deposited on a portion of the conductive winding.

20. The DC to DC converter of claim 14, further comprising an isolation layer between the conductive winding and the magnetic material.

21. The DC to DC converter of claim 14, wherein the magnetic material is a composite including a fully-sintered NiZn ferrite powder and the polymer.

22. The DC to DC converter of claim 14, wherein the cap layer is disposed on at least one side of the conductive winding and the magnetic core.

23. A method for fabrication of a power inductor in silicon, comprising:
depositing an initial conductive layer on a silicon substrate;
etching trenches in the silicon substrate;
forming a conductive winding having a plurality of turns in at least a portion of the trenches; and
depositing magnetic material in at least a portion of the trenches, the magnetic material including a composite of magnetic powder mixed with a polymer, where at least a portion of the magnetic material is encircled by the conductive winding, and at least a portion of a space between adjacent turns of the conductive winding is filled with the magnetic material.

24. The method of claim 23, wherein the trenches are through-substrate trenches.

25. The method of claim 23, wherein the magnetic material is deposited in the trenches before forming the conductive winding.

26. The method of claim 23, wherein the conductive winding is formed by electroplating.

27. The method of claim 23, wherein the magnetic material is deposited by hot pressing in a vacuum chamber.

28. The method of claim 23, wherein etching trenches in the silicon substrate comprises etching initial trenches before forming the conductive winding and depositing the magnetic material, and etching additional trenches between forming the conductive winding and depositing the magnetic material.

29. The method of claim 23, further comprising forming an isolation layer on sidewalls of at least a portion of the trenches.

* * * * *